(12) United States Patent
Fuke

(10) Patent No.: US 9,029,894 B2
(45) Date of Patent: May 12, 2015

(54) LEAD FRAME FOR OPTICAL SEMICONDUCTOR DEVICE AND OPTICAL SEMICONDUCTOR DEVICE USING THE SAME

(71) Applicant: Nitto Denko Corporation, Ibaraki-shi, Osaka (JP)

(72) Inventor: Kazuhiro Fuke, Osaka (JP)

(73) Assignee: Nitto Denko Corporation, Osaka (JP)

( * ) Notice: Subject to any disclaimer, the term of this patent is extended or adjusted under 35 U.S.C. 154(b) by 22 days.

(21) Appl. No.: 13/874,613

(22) Filed: May 1, 2013

(65) Prior Publication Data
US 2013/0292727 A1 Nov. 7, 2013

(30) Foreign Application Priority Data
May 1, 2012 (JP) .................................. 2012-104797

(51) Int. Cl.
| | | |
|---|---|---|
| H01L 33/00 | (2010.01) | |
| H01L 33/62 | (2010.01) | |
| H01L 23/00 | (2006.01) | |
| H01L 23/495 | (2006.01) | |
| H01L 33/48 | (2010.01) | |
| H01L 33/60 | (2010.01) | |

(52) U.S. Cl.
CPC .............. *H01L 23/495* (2013.01); *H01L 33/48* (2013.01); *H01L 33/60* (2013.01); *H01L 33/62* (2013.01); *H01L 24/97* (2013.01); *H01L 2224/48091* (2013.01); *H01L 2224/48247* (2013.01); *H01L 2224/45144* (2013.01); *H01L 2924/12041* (2013.01)

(58) Field of Classification Search
CPC . H01L 21/4821; H01L 21/4846; H01L 23/48; H01L 23/498; H01L 23/52; H01L 25/00; H01L 33/62; H01L 23/495; H01L 33/48; H01L 33/60; H01L 2924/12041; H01L 2224/48091; H01L 2224/48247; H01L 2224/45144
USPC ............. 257/13, 40, 79, 81, 98, 99, 100, 428, 257/431, 433, 666, 672, 676, 678, 687, 690, 257/692, 734, 787, 788, 789, 795, E33.058, 257/E33.066, E33.072
See application file for complete search history.

(56) References Cited

U.S. PATENT DOCUMENTS

| | | | | |
|---|---|---|---|---|
| 8,324,648 | B2 * | 12/2012 | Chien ............................. | 257/98 |
| 8,480,254 | B2 * | 7/2013 | Lu .............................. | 362/249.02 |
| 2007/0108436 | A1 * | 5/2007 | Sanmyo ......................... | 257/13 |
| 2010/0200882 | A1 * | 8/2010 | Kotani et al. .................... | 257/98 |
| 2011/0241028 | A1 * | 10/2011 | Park et al. ........................ | 257/88 |

FOREIGN PATENT DOCUMENTS

| | | |
|---|---|---|
| JP | 3934041 B2 | 6/2007 |
| JP | 2008-218964 A | 9/2008 |

* cited by examiner

*Primary Examiner* — Galina Yushina
(74) *Attorney, Agent, or Firm* — Sughrue Mion, PLLC

(57) ABSTRACT

The present invention relates to a lead frame for an optical semiconductor device including: a lead frame having a first plate part and a second plate part disposed so as to oppose to the first plate part; an optical semiconductor element placed in the second plate part and electrically connected to the second plate part; a wire for electrically connecting the optical semiconductor element and the first plate part to each other; a circumferential reflector formed on the lead frame so as to surround a circumference of the optical semiconductor element; and a transparent resin for encapsulating the optical semiconductor element, filled in a recess formed by the lead frame and an inner periphery of the reflector, in which the lead frame has a contour shape substantially the same as a bottom contour shape of the inner periphery of the reflector for forming the recess.

8 Claims, 7 Drawing Sheets

FIG. 5
CONVENTIONAL
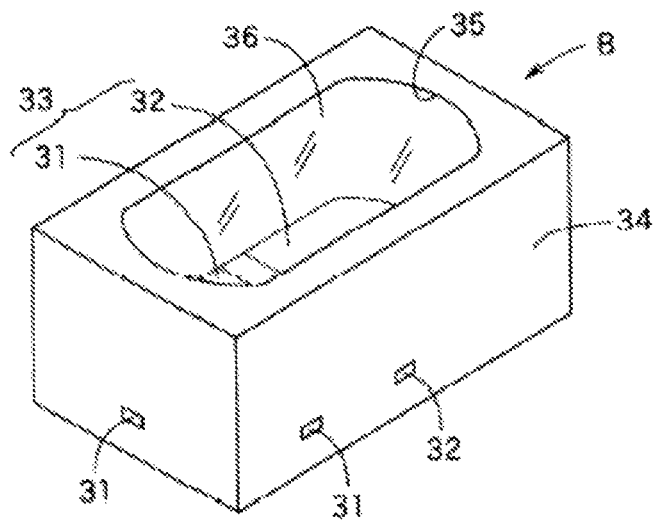
FIG. 6
CONVENTIONAL
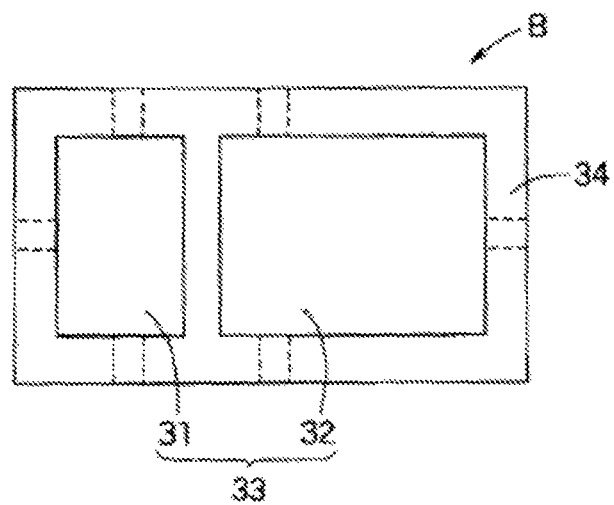

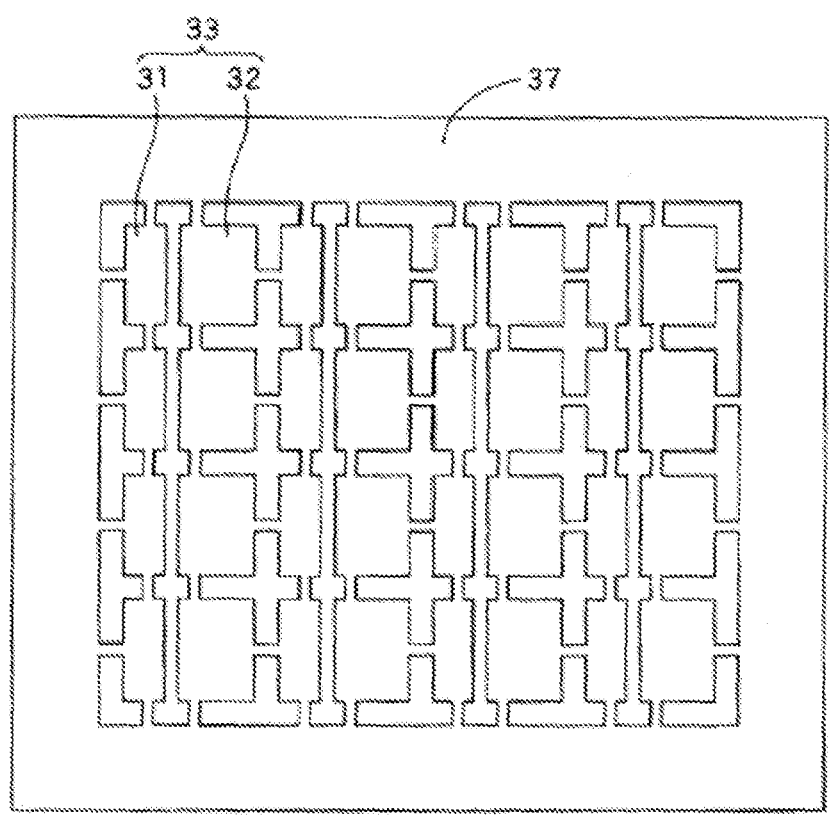
FIG. 7
CONVENTIONAL

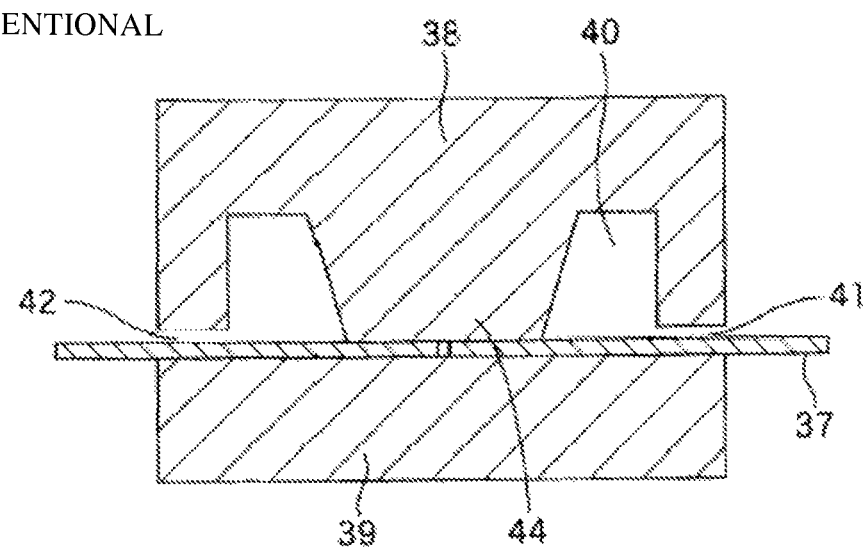
FIG. 8
CONVENTIONAL

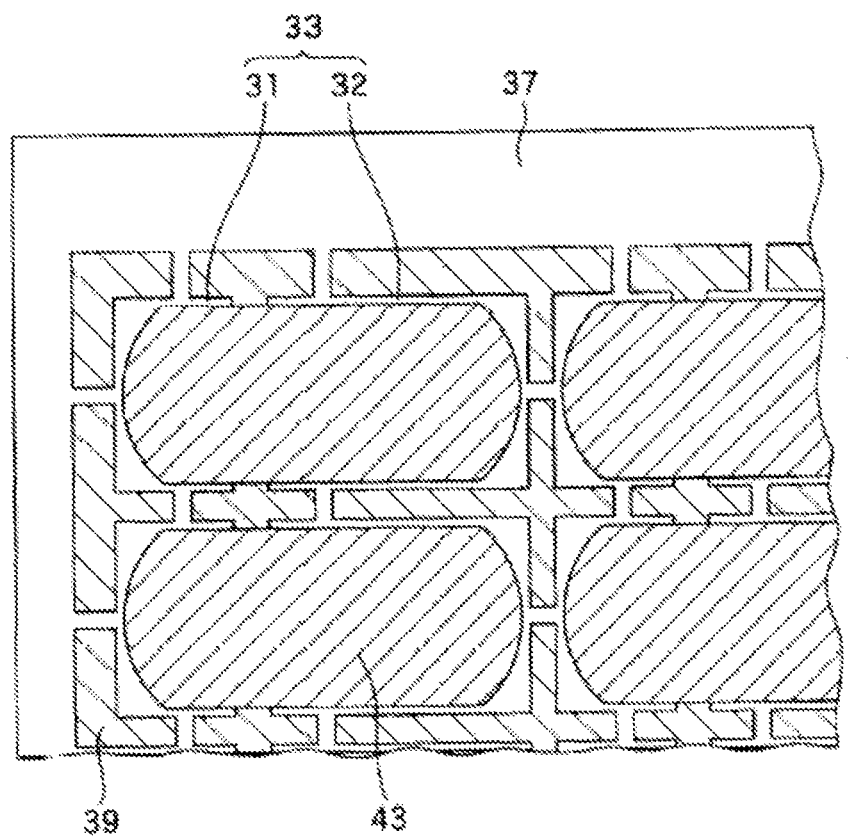
FIG. 9
CONVENTIONAL

LEAD FRAME FOR OPTICAL SEMICONDUCTOR DEVICE AND OPTICAL SEMICONDUCTOR DEVICE USING THE SAME

FIELD OF THE INVENTION

The present invention relates to a lead frame for an optical semiconductor device with a good quality and capable of manufacturing an optical semiconductor device at low costs. The invention also relates to an optical semiconductor device using the same.

BACKGROUND OF THE INVENTION

Conventionally, there have been optical semiconductor devices including an optical semiconductor element capable of emitting light having a prescribed wavelength. As such an optical semiconductor device, for example, an optical semiconductor device B shown in FIG. 5 is known. This optical semiconductor device B is configured of a lead frame 33 composed of a first plate part 31 and a second plate part 32, which is disposed on the bottom thereof; an optical semiconductor element (not shown) and the like placed on the second plate 32; a circumferential reflector 34 formed on the lead frame 33 so as to surround the optical semiconductor element; and a transparent resin 36 for encapsulating the inside of a recess 35 configured of the lead frame 33 and the reflector 34. Incidentally, FIG. 6 shows a state of the semiconductor device B seen from the rear surface side.

In order to enhance the manufacturing efficiency, for example, as shown in FIG. 7, in order that a large number of optical semiconductor devices may be produced at once, such an optical semiconductor device B is manufactured using a lead frame forming plate 37 having a large number of the lead frames 33 formed in continuity. That is, the optical semiconductor device B is manufactured by first arranging a large number of optical semiconductor elements in a line and mounting them on one sheet of the lead frame forming plate 37 to manufacture a large number of optical semiconductor devices at the same time and then cutting off the respective optical semiconductor devices and individualizing them from each other. In manufacturing the foregoing optical semiconductor device, the circumferential reflector 34 is formed in the lead frame forming plate 37 by resin molding, and examples of this resin molding include transfer molding. According to this method, as shown in FIG. 8, the reflector 34 can be formed by interposing the lead frame forming plate 37 into a molding die configured of an upper die 38 and a lower die 39 and performing clamping to form a cavity part 40, injecting a molten resin into the inside of this cavity part 40, and curing the injected resin, followed by demolding (see, for example, Patent Document 1). Incidentally, in FIG. 8, 41 is a side gate for injecting a molten resin, and 42 is an air vent for discharging internal air following the injection of a molten resin.

At that time, in order to produce a larger amount of the lead frames 33 from one sheet of the lead frame forming plate 37, the contour shape of the individual lead frame 33 is generally made in an approximate rectangle. On the other hand, since the reflector 34 is one for reflecting the light emitted from the optical semiconductor element toward the upper direction, it is formed in a circumferential state of surrounding the optical semiconductor element, and the contour shape of the bottom of the recess 35 formed by the lead frame 33 and the inner periphery of the reflector 34 is made in a form of an approximate circle or approximate oval (see FIG. 5).

Accordingly, at the time of transfer molding, there is likely caused such a problem that in the lead frame 33 located in the inside of the cavity part 40, the molten resin comes into a space between the lead frame 33 and the lower die 39 from the four corners thereof, whereby an unnecessary matter called a resin burr is formed on the rear surface of the lead frame 33. That is, in the lead frame 33, as shown in FIG. 9, at the time of clamping the upper and lower dies 38 and 39, though only a portion 43 with which the upper die 38 comes into contact is firmly interposed between the upper die 38 and the lower die 39, other portion does not come into contact with the upper die 38, so that an upper part thereof becomes in a free state. Accordingly, the molten resin comes into the space between the lower die 39 and the lead frame 33 from the four corners of the lead frame 33 located far from the portion 43 with which the upper die 38 comes into contact, whereby the resin burr is formed on the rear surface of the lead frame 33. At the time of performing electric mounting such as solder joint, e.g., IR reflow, the resin burr causes the repulsion of solder or the like, resulting in joint failure, and therefore, a step of removing this becomes necessary. Incidentally, the lower die 39 is seen from the through-holes of the lead frame forming plate 37.

In order to solve such a problem, in the field of molding a QFN (quad flat non-leaded) package, there is also adopted a technique of previously covering the rear surface of the lead frame 33 by an exclusive release tape prior to performing resin molding and removing a resin burr formed after the resin molding together with the release tape (see, for example, Patent Document 2).

Patent Document 1: JP-A-2008-218964
Patent Document 2: Japanese Patent No. 3934041

SUMMARY OF THE INVENTION

However, though the technique of removing the resin burr together with the release tape is excellent from the standpoint that the joint failure can be surely prevented from occurring, unnecessary costs are generated for installation of an exclusive apparatus, the release tape to be used, and the like. Accordingly, the development of more excellent techniques is demanded.

Under these circumstances, the invention has been made. An object of the invention is to provide an excellent lead frame for an optical semiconductor device, in which by making the contour shape of the lead frame in a special form, at the time of forming a reflector, a phenomenon in which the molten resin comes into a space between the lead frame and the lower die is prevented from occurring, and an unnecessary matter called a resin burr is not formed on the rear surface of the lead frame.

Namely, the present invention relates to the following items (1) to (9).

(1) A lead frame for an optical semiconductor device including:

a lead frame having a first plate part and a second plate part disposed so as to oppose to the first plate part;

an optical semiconductor element placed in the second plate part and electrically connected to the second plate part;

a wire for electrically connecting the optical semiconductor element and the first plate part to each other;

a circumferential reflector formed on the lead frame so as to surround a circumference of the optical semiconductor element; and a transparent resin for encapsulating the optical semiconductor element, filled in a recess formed by the lead frame and an inner periphery of the reflector, in which the lead frame has a contour shape substantially the same as a bottom contour shape of the inner periphery of the reflector for forming the recess.

(2) The lead frame for an optical semiconductor device according to item (1), in which the bottom contour shape of the inner periphery of the reflector is an approximate oval, and the contour shape of the lead frame is an approximate oval substantially the same as the approximate oval of the bottom contour shape of the inner periphery of the reflector.

(3) The lead frame for an optical semiconductor device according to item (1) or (2), the reflector is formed by transfer molding.

(4) The lead frame for an optical semiconductor device according to any one of items (1) to (3), in which the reflector is formed from a thermosetting resin composition.

(5) The lead frame for an optical semiconductor device according to item (4), in which the thermosetting resin composition has a flowability such that a spiral flow thereof is from 20 cm to 200 cm at a temperature of 175° C.

(6) The lead frame for an optical semiconductor device according to item (4) or (5), in which the thermosetting resin composition includes the following components (A) to (E):
(A) a white pigment;
(B) a filler;
(C) an epoxy resin;
(D) a curing agent; and
(E) a curing accelerator.

(7) The lead frame for an optical semiconductor device according to item (6), in which the white pigment is at least one selected from the group consisting of titanium oxide, zinc oxide, aluminum oxide, magnesium oxide, zirconium oxide, calcium carbonate, barium carbonate and barium sulfate.

(8) The lead frame for an optical semiconductor device according to item (6) or (7), in which the filler is silica.

(9) An optical semiconductor device including the lead frame for an optical semiconductor device according to any one of items (1) to (8),
in which the optical semiconductor device includes:
the lead frame having the contour shape substantially the same as the bottom contour shape of the inner periphery of the reflector;
the optical semiconductor element placed in the second plate part of the reflector and electrically connected to the second plate part;
the wire for electrically connecting the optical semiconductor element and the first plate part of the reflector to each other;
the circumferential reflector formed on the lead frame so as to surround the circumference of the optical semiconductor element; and
the transparent resin for encapsulating the optical semiconductor element, filled in the recess formed by the lead frame and the inner periphery of the reflector.

That is, in order to obtain a technique of quickly removing an unnecessary matter called a resin burr, which is formed on the rear surface of the lead frame at the time of forming a reflector, at low costs, the present inventor made extensive and intensive investigations. As a result, it has been found that by forming the lead frame so as to have a special contour shape but not removing the resin burr, the formation per se of the resin burr vanishes, leading to accomplishment of the invention.

In the light of the above, it has hitherto been always considered to overcome the problem on how to remove the resin burr at the time of forming a reflector, whereas the lead frame for an optical semiconductor device according to the invention is one obtained on the basis of an epoch-making idea to overturn an established concept so as to not generate the resin burr per se. That is, in the lead frame for an optical semiconductor device according to the invention, the contour shape of the lead frame is made substantially the same as the bottom contour shape of the inner periphery of the reflector. According to this configuration, at the time of subjecting the reflector to resin molding, the upper die comes into contact with the substantially entire surface of the lead frame, and an end of the lead frame does not come into the inside of the cavity, and therefore, a phenomenon in which the molten resin comes into a space between the lead frame and the lower die from the end of the lead frame can be prevented from occurring. In consequence, an unnecessary matter called a resin burr is not formed on the rear surface of the lead frame. Thus, a step of removing the resin burr is not necessary, and an optical semiconductor device with a good quality, which is free from the generation of joint failure, can be efficiently manufactured without using an exclusive release tape or the like.

Above all, when not only the bottom contour shape of the inner periphery of the reflector is an approximate oval, but also the contour shape of the lead frame is an approximate oval substantially the same as the foregoing approximate oval, the performance of the reflector per se can be enhanced, and an optical semiconductor device with a higher performance can be efficiently manufactured.

Then, when the reflector is formed by transfer molding, it can be formed in a more minute shape, and therefore, an optical semiconductor device with a higher performance can be obtained.

Furthermore, when the reflector is formed from a thermosetting resin composition, even if the cavity part of the die is a minute shape, the thermosetting resin composition can be filled leaving no space, and therefore, an optical semiconductor device with high reliability can be obtained.

Then, when the thermosetting resin composition has a flowability such that a spiral flow thereof is from 20 cm to 200 cm at a temperature of 175° C., not only filling of the thermosetting resin composition into the cavity part of the die can be more easily performed leaving no space, but also the formation of a resin burr can be more likely suppressed.

In addition, when the thermosetting resin composition includes the following components (A) to (E), not only excellent moldability and durability are revealed, but also light can be efficiently reflected:
(A) a white pigment;
(B) a filler;
(C) an epoxy resin;
(D) a curing agent; and
(E) a curing accelerator.

Furthermore, when at least one selected from the group consisting of titanium oxide, zinc oxide, aluminum oxide, magnesium oxide, zirconium oxide, calcium carbonate, barium carbonate and barium sulfate is used as the white pigment that is the component (A) of the thermosetting resin composition, light can be much more efficiently reflected.

Then, when silica is used as the filler that is the component (B) of the thermosetting resin composition, much more excellent moldability and durability are revealed.

Furthermore, in the optical semiconductor device according to the invention, since the resin burr per se is not formed on the rear surface of the lead frame, a step of removing this is not necessary, and the optical semiconductor device is efficiently manufactured. In addition, since the resin burr is not formed on the rear surface of the lead frame, the performance can be sufficiently exhibited.

Incidentally, it is meant that the "approximate oval" as referred to in the invention includes not only an oval but a circle or an irregular oval in which a pair of short sides of a rectangle opposing to each other is replaced by a circular arc.

BRIEF DESCRIPTION OF THE DRAWING

FIG. 5 is a view showing a conventional optical semiconductor device.

FIG. 6 is a view showing a state where the foregoing conventional optical semiconductor device is seen from the rear surface.

FIG. 7 is a plan view of a lead frame which is used for the foregoing conventional optical semiconductor device.

FIG. 8 is an explanatory view of a die which is used for the formation of a reflector in the foregoing conventional optical semiconductor device.

FIG. 9 is an explanatory view of the foregoing conventional optical semiconductor device.

DETAILED DESCRIPTION OF THE INVENTION

Next, embodiments for carrying out the invention are described.

Figure 1:
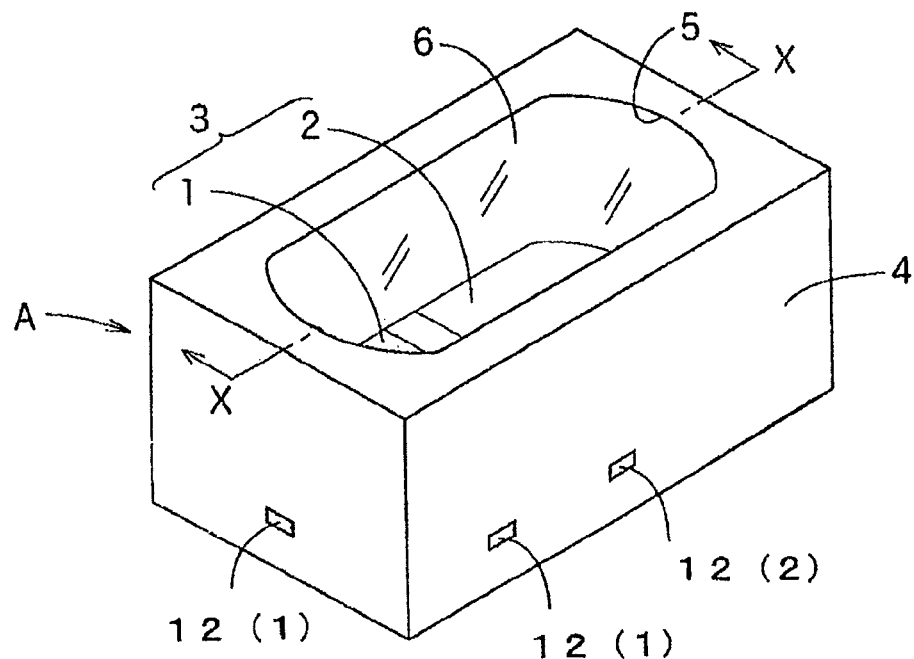
FIG. 1 is an appearance perspective view showing an embodiment of an optical semiconductor device according to the invention.
Figure 2:
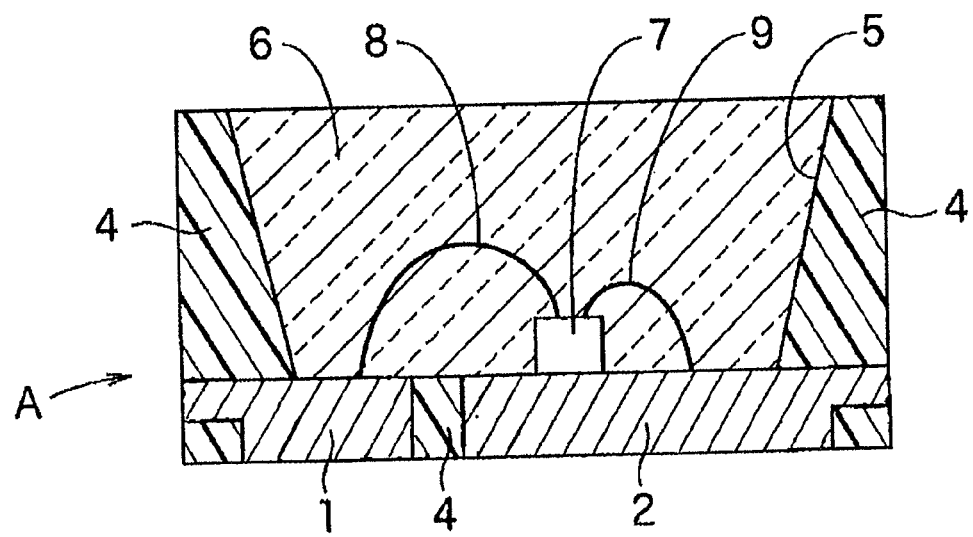
FIG. 2 is an X-X cross-sectional view of the optical semiconductor device of FIG. 1.

FIG. 1 is a view showing an optical semiconductor device A that is an embodiment of the invention, and FIG. 2 is an X-X cross-sectional view thereof. This optical semiconductor device A is formed in, for example, a rectangular parallelepiped shape having a width of 1.40 mm, a length of 3.00 mm, and a height of 0.75 mm. The optical semiconductor device A includes a lead frame 3 having a first plate part 1 and a second plate part 2; an optical semiconductor element 7 which is placed on the second plate part 2 and electrically connected to the first plate part 1; a wire 8 for electrically connecting this optical semiconductor element 7 and the first plate part 1 to each other; a wire 9 for electrically connecting this optical semiconductor element 7 and the second plate part 2 to each other; a circumferential reflector 4 formed on the lead frame 3 so as to surround the circumference of the optical semiconductor element 7; and a transparent resin 6 for encapsulating the optical semiconductor element, filled in a recess 5 which is formed by the lead frame 3 and the reflector 4. In the reflector 4, the bottom contour shape of the inner periphery thereof is formed in an approximate oval, and the reflector 4 is formed substantially along the contour shape of the lead frame 3. Incidentally, the size and shape of the optical semiconductor device A are properly chosen. In addition, in FIG. 1, the size, shape, thickness, etc. of each of the sites are schematically shown and are different from actual ones (also the same in the figures as described below).

Figure 3:
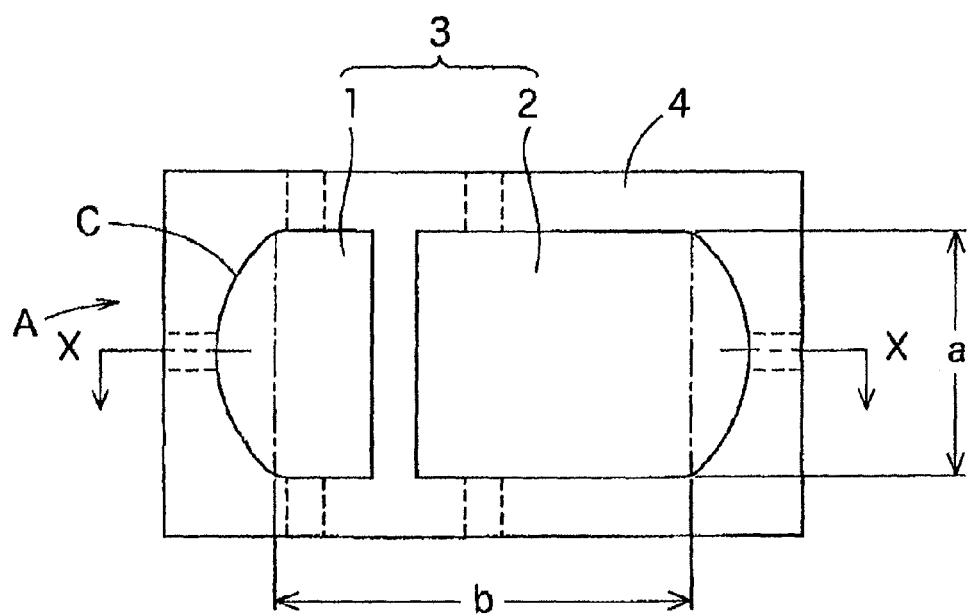
FIG. 3 is a view showing a state where the foregoing optical semiconductor device is seen from the rear surface.

The lead frame 3 is described in detail. In this lead frame 3, as shown in FIG. 3 showing a state where the optical semiconductor device A is seen from the rear surface, the contour shape of the whole combining the first plate part 1 and the second plate part 2 is an approximate oval. This approximate oval shape is described in more detail. For example, the approximate oval shape has a shape in which a rectangle having a short side a (length: 0.90 mm) and a long side b (1.90 mm), a pair of short sides opposing to each other is replaced by a circular arc c having a radius of curvature of 0.3 mm, and it is a quite different shape from the contour shape (approximate rectangle) of the conventional lead frame. In this way, it is the most important characteristic feature of the invention that the contour shape of the lead frame 3 is made substantially the same as the bottom contour shape of the inner periphery of the reflector 4.

Figure 4:
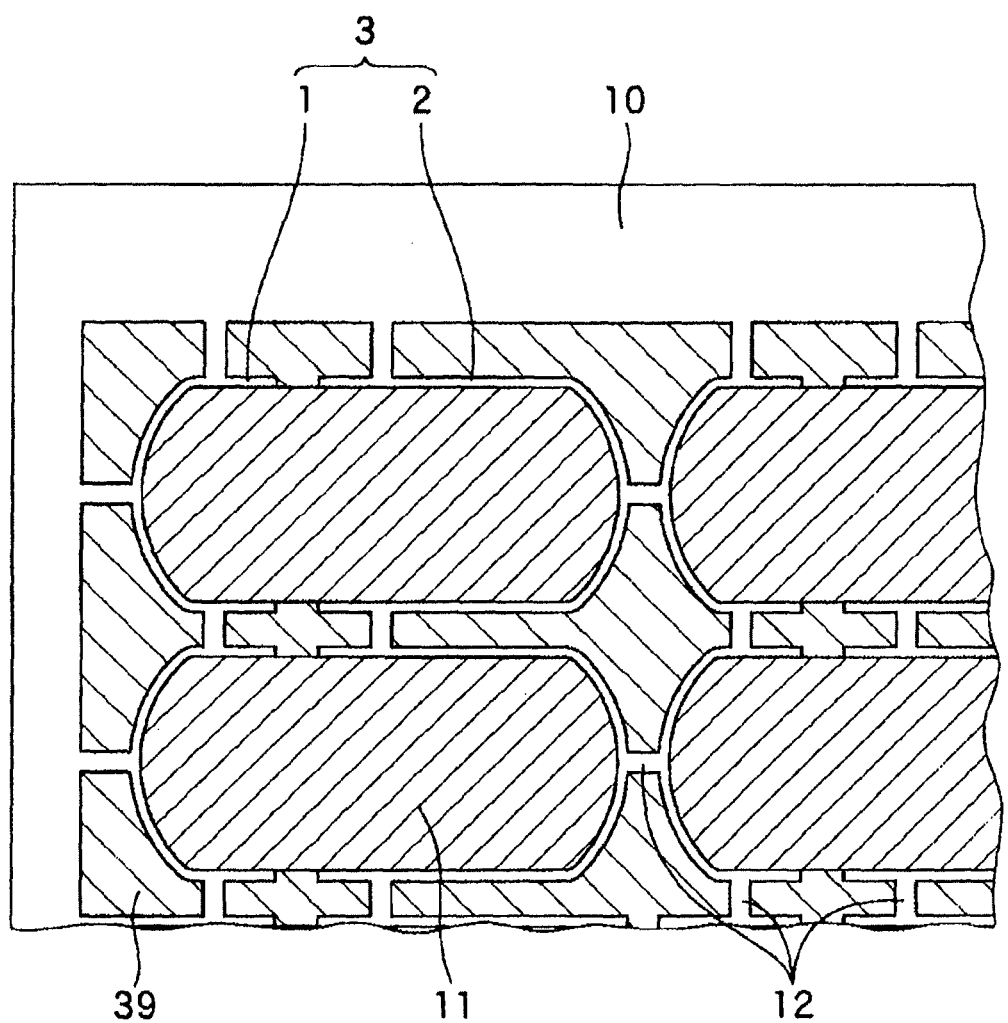
FIG. 4 is an explanatory view of the foregoing optical semiconductor device.

Such an optical semiconductor device A can be, for example, obtained in the following manner. That is, as shown in FIG. 4, the circumferential reflector 4 is formed on one sheet of a lead frame forming plate 10 by transfer molding. At that time, the contour shape of the individual lead frame 3 is made substantially the same as the bottom shape (approximate oval) of the recess 5 configured of the lead frame 3 and the inner periphery of the reflector 4, and therefore, the substantially entire surface of the lead frame 3 is firmly pressed to an extent of its end by a projection 44 of the upper die 38 (see FIG. 8) which is used for the transfer molding. In consequence, the substantially entire surface of the lead frame 3 is interposed between the upper die 38 and the lower die 39. Therefore, the molten resin does not come into a space between the lead frame 3 and the lower die 39, and a resin burr is not formed on the rear surface of the lead frame 3. Incidentally, in FIG. 4, 11 shows a portion where the upper die 38 and the lead frame 3 come into contact with each other, and the lower die 39 in the contact state is seen from the though-holes of the lead frame forming plate 10.

Thereafter, the optical semiconductor element 7 is placed on the respective lead frame 3 (second plate part 2) within the recess 5 configured of the lead frame 3 and the inner periphery of the reflector 4. These are electrically connected to the first or second plate part (1 or 2), and the inside of the recess 5 is encapsulated with the transparent resin 6, followed by cutting off for every package. There can be thus obtained the optical semiconductor device A shown in FIG. 1.

In this way, when the optical semiconductor device A is manufactured using the lead frame 3 according to the invention, an unnecessary matter called a resin burr is not formed on the rear surface of the lead frame 3, and therefore, a step of removing the resin burr is not necessary, and an exclusive release tape may not be used. In consequence, the optical semiconductor device A can be quickly manufactured at low costs. In addition, since the optical semiconductor device A according to the invention uses the lead frame 3 according to the invention in this way, it is free from the generation of joint failure to be caused due to a resin burr and excellent in the performance.

As the lead frame 3 having the first plate part 1 and the second plate part 2, ones having conductivity can be used. Above all, copper and its alloys are preferably used from the standpoints of excellent electrical and heat conductivity and strength.

In addition, it is preferable to apply plating to the lead frame 3 from the standpoints of not only high reflectance and excellent wire bonding properties but also good solder wettability at the time of mounting as an optical semiconductor device. Examples of such a plating material include gold, silver, nickel, tin, and palladium. Above all, silver is preferably used from the standpoint that a high reflectance is obtained.

The circumferential reflector 4 formed on the lead frame 3 so as to surround the circumference of the optical semiconductor element 7 is preferably made of a thermoplastic resin such as polyamides, polyesters, and liquid crystal polymers, or a thermosetting resin such as epoxy resins and silicone resins. Especially, a thermosetting resin is more preferable from the standpoints that it is able to come into close contact with the lead frame 3; and that it is able to easily fill the molten resin even in a minute cavity part leaving no space.

In addition, in the case of performing the formation of the reflector 4 by resin molding, in order to much more suppress the generation of a resin burr, a spiral flow of the thermosetting resin composition to be used is preferably in the range of from 20 cm to 200 cm, and more preferably in the range of from 25 cm to 150 cm at 175° C. This is because when the spiral flow is too low, it is difficult to fill the cavity part of the die leaving no space, whereas when the spiral flow is too high, there is a concern that a resin burr is rather generated due to a pressure applied to the resin at the time of molding. Incidentally, the measured value of the spiral flow is one measured by a die heated at 175° C. in accordance with the EMMI (Epoxy Molding Material Institute) standards using a 15-t pressing machine.

As such a thermosetting resin composition, for example, ones containing respective components of (A) a white pigment, (B) a filler, (C) an epoxy resin, (D) a curing agent, and (E) a curing accelerator are suitably used.

As the white pigment (A), a material having a refractive index different from all of the foregoing components (C) to (E) can be used. As such a material, examples of those having a higher refractive index than the components (C) to (E) include titanium oxide, zinc oxide, aluminum oxide, magnesium oxide, antimony oxide, zirconium oxide, white lead, kaolin, alumina, calcium carbonate, barium carbonate, barium sulfate, zinc sulfate, and zinc sulfide. In addition, examples of those having a lower refractive index than the components (C) to (E) include hollow particles whose interiors have become hollow, such as hollow particles of silica, soda-lime glass, borosilcate glass, alkali-free glass, etc. Above all, it is preferable to use titanium oxide, zinc oxide, aluminum oxide, magnesium oxide, zirconium oxide, calcium carbonate, barium carbonate, or barium sulfate from the standpoints that a difference in the refractive index from the components (C) to (E) is large; and that a high reflectance is obtained. These can be used alone or in combination of two or more kinds thereof.

In addition, examples of the filler (B) include silica, aluminum hydroxide, magnesium hydroxide, and magnesium carbonate. Above all, it is preferable to use silica from the standpoints of excellent heat conductivity, reflecting properties, moldability, and flame retardancy. Incidentally, those which are used as the white pigment (A) are excluded from this filler (B). These can be used alone or in combination of two or more kinds thereof.

Then, as the epoxy resin (C), those which are used for electronic component encapsulation can be used. Examples thereof include materials obtained by epoxidizing a novolak resin made of a phenol and an aldehyde, such as phenol novolak type epoxy resins and ortho-cresol novolak type epoxy resins; glycidylamine type epoxy resins obtained through a reaction of a diglycidyl ether such as bisphenol A, bisphenol F, bisphenol S, and an alkyl-substituted bisphenol, a polyamine such as diaminodiphenylmethane and isocyanuric acid, and epichlorohydrin; and linear aliphatic epoxy resins and alicyclic epoxy resins obtained by oxidizing an olefin bond with a peracid such as peracetic acid. Above all, those which are relatively low in coloration are preferable; and a bisphenol A type epoxy resin, a bisphenol F type epoxy resin, a bisphenol S type epoxy resin, diglycidyl isocyanurate, triglycidyl isocyanurate, or the like is preferably used. These can be used alone or in combination of two or more kinds thereof.

Furthermore, as the curing agent (D), those which are relatively low in coloration are preferable. Examples thereof include acid anhydride curing agents, isocyanuric acid derivatives, and phenolic curing agents. These can be used alone or in combination with two or more kinds thereof.

In addition, examples of the curing accelerator (E) include tertiary amines such as 1,8-diaza-bicyclo(5,4,0)undecene-7, triethylenediamine, and tri-2,4,6-dimethylaminomethylphenol; imidazoles such as 2-ethyl-4-methylimidazole and 2-methylimidazole; phosphorus compounds such as triphenylphosphine, tetraphenylphosphonium tetraphenylborate, tetra-n-butylphosphonium-o,o-diethylphosphorodithioate, tetra-n-butylphosphonium-tetrafluoroborate, and tetra-n-butylphosphonium-tetraphenylborate; quaternary ammonium salts; organic metal salts; and derivatives thereof. These can be used alone or in combination of two or more kinds thereof. These can be used alone or in combination of two or more kinds thereof.

The reflector 4 can be formed by transfer molding, compression molding, or the like. Above all, it is preferable to adopt transfer molding from the standpoint that high productivity is obtained.

In addition, the die which is used at the time of resin molding of the reflector 4 includes the plate-shaped lower die 39 having a flat surface and the upper die 38 having the recess corresponding to the shape of the reflector 4 and the projection 44 corresponding to the inner periphery shape of the reflector 4, and by clamping them, the cavity part 40 corresponding to the shape of the reflector 4 is formed. The reflector 4 is formed by filling the molten resin in this cavity part 40. At that time, the projection 44 of the upper die 38 comes into contact with the substantially entire surface of the lead frame 3 and firmly presses this. Therefore, the molten resin does not come into a space between the lead frame 3 and the lower die 39, and a resin burr is not formed on the rear surface of the lead frame 3.

The optical semiconductor element 7 which is placed on the lead frame 3 (second plate part 2) is a light emitting element capable of converting a current into light or a light receiving element capable of converting light into a current. Examples thereof include a light emitting diode (LED), a photodiode, and a phototransistor. In addition, in this embodiment, the case where the optical semiconductor element 7 is single is described. However, the optical semiconductor element 7 is not limited to a single structure but may be a structure composed of plural members thereof. Then, in fixing the optical semiconductor element 7 onto the lead frame 3 (second plate part 2), for example, the fixation can be performed using a paste agent including a silicon resin, an epoxy resin, or the like, or a sheet-shaped organic material. In addition, the fixation can also be performed using a metal such as gold.

As the wires 8 and 9 for electrically connecting the optical semiconductor element 7 and the lead frame 3 (first and second plate parts 1 and 2) to each other, those made of gold, silver, or copper are preferably used. In addition, in FIG. 2, though each of the wires 8 and 9 is shown as a single wire, a plurality of wires may be provided for each of them as the need arises.

As the transparent resin 6 which is filled in the recess 5 formed by the lead frame 3 and the inner periphery of the reflector 4, a resin whose cured material has transparency is used, and for example, silicone resins, epoxy resins, and the like are preferably used. Incidentally, in the invention, the terms "has transparency" mean a material having a transmittance of 80% or more, and a material having a transmittance of 90% or more is preferable.

In addition, the transparent resin 6 can be blended with a variety of phosphors. By blending with a phosphor, light having a desired color tone can be easily obtained by a combination of a luminescent color from the optical semiconductor element with a fluorescent color from the phosphor. Examples of such a phosphor include YAG (yttrium-aluminum-garnet) materials, TAG (terbium-aluminum-garnet) materials, silicate materials, and sialon materials.

As shown in FIG. 1, in the thus obtained optical semiconductor device A having been cut into an individual package unit, cut surfaces of connection points 12 (see FIG. 4) of the lead frames 3 (or ends thereof) to each other, which extend from the lead frames 3 (the first plate part 1 and the second plate part 2), appear on the side surfaces of the optical semiconductor device A. These cut surfaces are required to be present at positions far from the bottom of the optical semiconductor device A. For this reason, in the lead frame forming plate 10, each of the connection points 12 is provided with a notch from the bottom side. Such a notch can be, for example, formed by etching, forging, or the like prior to forming the reflector 4 or applying plating to the lead frame forming plate 10. Especially, etching is preferably adopted from the standpoint that it is possible to form a minute shape. Above all, a wet process using a chemical solution or the like is preferably adopted from the standpoint that it is possible to contrive to enhance the productivity.

EXAMPLES

Next, Example is given below together with Comparative Example. However, it should not be construed that the invention is limited to these Examples.

First of all, prior to reviewing the Example and Comparative Example, a material having the following composition was prepared as a thermosetting resin composition (I) for forming a reflector.
[Thermosetting Resin Composition (I)]

The thermosetting resin composition (I) was prepared by melt mixing respective raw materials of 100 parts by weight of triglycidyl isocyanurate as an epoxy resin, 168 parts by weight of hexahydrophthalic anhydride as a curing agent, 2 parts by weight of tetra-n-butylphosphonium-o,o-diethylphosphorodithioate as a curing accelerator, 568 parts by weight of rutile type titanium dioxide (average particle diameter: about 0.2 μm) as a white pigment, and 1,220 parts by weight of fused silica (average particle diameter: about 45 μm) as a filler.

In addition, a material having the following composition was prepared as a transparent resin composition (II) for encapsulating an optical semiconductor element.
[Transparent Resin Composition (II)]

The transparent resin composition (II) was prepared by mixing respective raw materials of 100 parts by weight of 3,4-epoxycyclohexenylmethyl-3',4'-epoxycyclohexene carboxylate as an epoxy resin, 93 parts by weight of hexahydrophthalic anhydride as a curing agent, and 1 part by weight of N,N-dimethylbenzylamine as a curing accelerator at ordinary temperature just before use.

Example 1

A base material plate made of a copper alloy material was prepared as the lead frame forming plate 10; and not only through-holes were provided in prescribed places by etching, but also the rear surface side of the connection point 12 of the lead frames 3 (or ends thereof) to each other was subjected to half-etching, thereby manufacturing a plurality of the lead frames 3 each having the first plate part 1 and the second plate part 2 and having a contour shape of an approximate oval as shown in FIGS. 3 and 4, followed by entirely plating with silver. This lead frame forming plate 10 was interposed between the upper and lower dies 38 and 39; the molten thermosetting resin composition (I) was poured into the cavity part 40 formed by the upper and lower dies 38 and 39; and after curing of the resin, this was demolded to form the circumferential reflector 4 on the lead flame 3. Subsequently, an optical semiconductor element (LED) was placed on the second plate part 2; this was electrically connected to the first and second plate parts 1 and 2 with a gold wire; and thereafter, the recess 5 formed by the lead frame 3 and the inner periphery of the reflector 4 was encapsulated with the transparent resin composition (II), thereby manufacturing an optical semiconductor device forming body. This optical semiconductor device forming body was cut out into a package unit as shown in FIG. 1, thereby fabricating an optical semiconductor device of Example 1.

Comparative Example 1

An optical semiconductor device forming body was manufactured in the same manner as that in Example 1, except that the contour shape of the lead frame was changed to an approximate rectangle as shown in FIGS. 6 and 9, thereby fabricating an optical semiconductor device of Comparative Example 1.

Twenty samples of each of the thus obtained optical semiconductor devices of Example 1 and Comparative Example 1 were prepared and observed by visual inspection from the rear surface side thereof, thereby achieving appearance evaluation. As a result, as for the product of Example 1, in all of the twenty samples having been subjected to appearance evaluation, a resin burr was not generated at all. On the other hand, as for the product of Comparative Example 1, in all of the twenty lead frames having been subjected to appearance evaluation, in the four corners thereof, a resin burr was generated on the substantially entire surface of a portion with which the upper die 38 did not come into contact.

It is noted from the foregoing results that when the lead frame for an optical semiconductor device according to the invention is used, the generation of a resin burr in the step of forming a reflector can be surely suppressed.

While the invention has been described in detail with reference to specific embodiments thereof, it will be apparent to one skilled in the art that various changes and modifications can be made therein without departing from the spirit and scope thereof.

Incidentally, the present application is based on Japanese Patent Application No. 2012-104797 filed on May 1, 2012, and the contents are incorporated herein by reference.

All references cited herein are incorporated by reference herein in their entirety.

According to the lead frame for an optical semiconductor device according to the invention, an unnecessary matter called a resin burr is not formed on the rear surface of the lead frame in the step of forming a reflector. Accordingly, a step of removing the resin burr is not necessary, and an optical semiconductor device with a good quality, which is free from the generation of joint failure, can be efficiently manufactured.

DESCRIPTION OF REFERENCE NUMERALS AND SIGNS

1: First plate part
2: Second plate part
3: Lead frame
4: Reflector
5: Recess
6: Transparent resin

What is claimed is:

1. A lead frame with a circumferential reflector for an optical semiconductor device comprising:
   a lead frame having a first plate part and a second plate part disposed so as to oppose to the first plate part; and
   the circumferential reflector formed on the lead frame;
   wherein the lead frame has a contour shape substantially the same as a bottom contour shape of an inner periphery of the circumferential reflector which forms a recess with the lead frame, and
   the bottom contour shape of the inner periphery of the reflector is an approximate oval, and the contour shape of the lead frame is an approximate oval substantially the same as the approximate oval of the bottom contour shape of the inner periphery of the reflector.

2. The lead frame with a circumferential reflector for an optical semiconductor device according to claim 1, the circumferential reflector is formed by transfer molding.

3. An optical semiconductor device comprising the lead frame with a circumferential reflector for an optical semiconductor device according to claim 1,
   wherein the optical semiconductor device further comprises:
   an optical semiconductor element placed on the second plate part of the lead frame and electrically connected to the second plate part;
   a wire for electrically connecting the optical semiconductor element and the first plate part of the lead frame to each other;
   a transparent resin for encapsulating the optical semiconductor element, filled in the recess formed by the lead frame and the inner periphery of the circumferential reflector.

4. The lead frame with a circumferential reflector for an optical semiconductor device according to claim 1, wherein the circumferential reflector is formed from a thermosetting resin composition.

5. The lead frame with a circumferential reflector for an optical semiconductor device according to claim 4, wherein the thermosetting resin composition has a flowability such that a spiral flow thereof is from 20 cm to 200 cm at a temperature of 175° C.

6. The lead frame with a circumferential reflector for an optical semiconductor device according to claim 4, wherein the thermosetting resin composition comprises the following components (A) to (E): (A) a white pigment; (B) a filler; (C) an epoxy resin; (D) a curing agent; and (E) a curing accelerator.

7. The lead frame with a circumferential reflector for an optical semiconductor device according to claim 6, wherein the white pigment is at least one selected from the group consisting of titanium oxide, zinc oxide, aluminum oxide, magnesium oxide, zirconium oxide, calcium carbonate, barium carbonate and barium sulfate.

8. The lead frame with a circumferential reflector for an optical semiconductor device according to claim 6, wherein the filler is silica.

* * * * *